United States Patent
Ishizaka et al.

(10) Patent No.: US 9,406,558 B2
(45) Date of Patent: Aug. 2, 2016

(54) CU WIRING FABRICATION METHOD AND STORAGE MEDIUM

(71) Applicant: TOKYO ELECTRON LIMITED, Tokyo (JP)

(72) Inventors: Tadahiro Ishizaka, Nirasaki (JP); Tatsuo Hirasawa, Nirasaki (JP); Takashi Sakuma, Nirasaki (JP); Osamu Yokoyama, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/701,555

(22) Filed: May 1, 2015

(65) Prior Publication Data
US 2015/0332961 A1   Nov. 19, 2015

(30) Foreign Application Priority Data
May 16, 2014   (JP) ................. 2014-102456

(51) Int. Cl.
*H01L 21/768* (2006.01)
*H01L 21/285* (2006.01)

(52) U.S. Cl.
CPC ...... *H01L 21/76882* (2013.01); *H01L 21/2855* (2013.01); *H01L 21/76843* (2013.01); *H01L 21/76876* (2013.01); *H01L 21/76883* (2013.01)

(58) Field of Classification Search
CPC ................................... H01L 21/76882
See application file for complete search history.

(56) References Cited

FOREIGN PATENT DOCUMENTS

| JP | 2006148075 A | 6/2006 |
|----|--------------|--------|
| JP | 2010021447 A | 1/2010 |
| JP | 2012-169590 A | 9/2012 |

*Primary Examiner* — Alexander Ghyka
(74) *Attorney, Agent, or Firm* — Nath, Goldberg & Meyer; Jerald L. Meyer

(57) ABSTRACT

Cu wiring fabrication method for fabricating Cu wiring with respect to substrate having interlayer dielectric film having trench formed thereon, includes: forming barrier film on surface of the trench; forming Ru film on surface of the barrier film by CVD; burying the trench by forming Cu film or Cu alloy film on the Ru film; forming Cu film or Cu alloy film at corners of bottom of the trench while re-sputtering the formed Cu film or Cu alloy film in a condition where first formed Cu film or Cu alloy film re-sputtered by an ion action of the plasma generation gas; and subsequently burying the Cu film or the Cu alloy film in the trench in condition where the Cu film or the Cu alloy film is formed on field portion of the substrate, and reflows in the trench by an ion action of the plasma generation gas.

8 Claims, 8 Drawing Sheets

Re-sputtering step (Step S4-1)

Normal film forming step (Step S4-2)

Sample A

Sample B

Sample C

±90%

Sample D

±60%

Sample E

Sample F

CU WIRING FABRICATION METHOD AND STORAGE MEDIUM

CROSS-REFERENCE TO RELATED APPLICATION

This application claims the benefit of Japanese Patent Application No. 2014-102456, filed on May 16, 2014, in the Japan Patent Office, the disclosure of which is incorporated herein in its entirety by reference.

TECHNICAL FIELD

The present disclosure relates to a Cu wiring fabrication method for fabricating a Cu wiring by burying Cu in a trench formed in a substrate, and a non-transitory computer-readable storage medium.

BACKGROUND

In the manufacture of semiconductor devices, a required device is fabricated by repeatedly performing a variety of types of processes, such as film forming processing and etching processing, on a semiconductor wafer. In recent years, in line with the needs of high speed, fine wiring pattern, and higher integration of semiconductor devices, a wiring needs to have low resistance (improved conductivity) and improved tolerance to electromigration.

For this reason, copper (Cu) having higher conductivity (lower resistance) and higher tolerance to electromigration than aluminum (Al) or tungsten (W) are used as materials for wirings.

A technology has been used in which a barrier film made of tantalum (Ta), titanium (Ti), tantalum nitride (TaN), or titanium nitride (TiN) is formed on the entire interlayer dielectric film in which trenches or holes have been formed using a plasma sputter, that is, a physical vapor deposition (PVD) method. In this process, a Cu seed film is formed on the barrier film in the same manner using a plasma sputter, and the trenches or the holes are fully buried by performing Cu plating on the Cu seed film. A Cu thin film and a barrier film remaining on a surface of the wafer are removed by polishing and are processed using chemical mechanical polishing (CMP) processing to form a Cu wiring.

However, as the design rule of semiconductor devices gradually becomes more fine, the wettability of the Cu film for a barrier film is poor and PVD basically has low step coverage. Accordingly, it is difficult to soundly form the Cu seed layer within the trenches or the holes using PVD, and thus a void is generated in the Cu film when the trenches or the holes are buried with the Cu film.

In this aspect, a technology has been used in which an Ru film having an excellent wettability for Cu is formed on a barrier film made of Ta or TaN using CVD having basically excellent step coverage. Once the Ru film is formed on the barrier film the Cu is buried in the barrier film.

Furthermore, there has also been proposed a technology in which a Cu film is buried using ionized physical vapor deposition (iPVD) after the Ru film is formed using CVD as described above. Accordingly, the CVD-Ru film having excellent step coverage is thinly formed in order to increase the volume of the Cu film as much as possible and an iPVD film is formed at a relatively high temperature in order to increase the crystalline size of the Cu film, thereby being capable of making a Cu wiring have low resistance through a synergy effect. Furthermore, iPVD can obtain an excellent burial property even in the case of a fine trench because the overhang of a trench width can be suppressed by the etching action of Ar ions and the like.

SUMMARY

In the burial of a Cu film for a trench using iPVD, however, Cu within a field portion migrates on an Ru film, enters a trench, and gathers at the bottom of the trench. Thereafter, Cu is stabilized and filled in the trench from bottom to top. During the burial, Cu always moves on the bottom of the trench as well as on the field. In a micro wiring, however, Cu may easily stabilized because the volume of Cu is small and the distance between trench sidewalls (i.e., a wiring width) is small.

However, semiconductor devices become fine. In actual devices, in general, wirings having various widths, such as a 30 nm width, a 50 nm width, and a 100 nm width, in addition to a wiring of about 20 nm in width, that is, the smallest width, are mixed in a single wiring layer. If a wiring width is increased, new problems, such as those described below, may occur. That is, if a wiring width is wide, the width of a trench that defines the wiring width is increased, and thus Cu freely moves at the bottom of a trench where Cu gathers unlike in a micro wiring. Accordingly, Cu may easily form a large lump. In a prior art, a burial failure, such as that bottom-up is not uniformly performed or a cause of void formation, is generated due to the presence of such a large lump because the behavior of Cu at the bottom of the trench cannot be controlled.

Some embodiments of the present disclosure provide a Cu wiring fabrication method capable of suppressing a burial failure by suppressing a Cu lump from being formed at the bottom of a trench regardless of a trench size.

According to one embodiment of the present disclosure, there is provided a Cu wiring fabrication method for fabricating a Cu wiring with respect to a substrate having an interlayer dielectric film on which a trench of a specific pattern is formed. The method comprises: forming a barrier film on at least a surface of the trench; forming an Ru film on a surface of the barrier film by CVD; and burying the trench by forming a Cu film or a Cu alloy film on the Ru film, wherein when forming the Cu film or the Cu alloy film, a film forming apparatus is used. The film forming apparatus is configured to have the substrate disposed in a processing container, generate plasma by supplying a plasma generation gas to the processing container, discharge particles formed of Cu or a Cu alloy from a target formed of Cu or a Cu alloy and disposed in the processing container, ionize the particles formed of Cu or the Cu alloy by ions of the plasma generation gas within the processing container, apply a high frequency bias to the substrate, and introduce the ions of the plasma generation gas and the ionized particles formed of Cu or the Cu alloy into the substrate. The method further comprises: forming a Cu film or Cu alloy film at corners of a bottom of the trench while re-sputtering the formed Cu film or Cu alloy film in a condition in which a first formed Cu film or Cu alloy film is re-sputtered by an ion action of the plasma generation gas; and subsequently burying the Cu film or the Cu alloy film in the trench in a condition in which the Cu film or the Cu alloy film is formed on a field portion of the substrate, and the Cu film or Cu alloy film of the field portion reflows in the trench by an ion action of the plasma generation gas.

According to another embodiment of the present disclosure, there is provided a non-transitory computer-readable storage medium storing a program operated on a computer, for controlling a Cu wiring fabrication system, wherein when the program is executed, the program makes the computer control the Cu wiring fabrication system so that the aforementioned Cu wiring fabrication method is executed.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 3A and 3B are perspective views diagrammatically illustrating the state of Cu when forming a Cu film using iPVD, wherein FIG. 3B illustrates the state when a film is formed using iPVD in an initial normal condition and FIG. 3B illustrates the state when a re-sputtering step is first performed.

FIGS. 5A and 5B are cross-sectional SEM photographs of samples when the burial of a Cu film is stopped at an early stage after it is performed on a trench of 140 nm in width, wherein FIG. 5A illustrates a sample (a sample A) when the burial of the Cu film is stopped at an early stage after it is performed in a normal iPVD step and FIG. 5B illustrates a sample (a sample B) when the burial of the Cu film is stopped at an early stage after it is performed in a re-sputtering step.

FIGS. 6A and 6B are cross-sectional SEM photographs of samples when the burial of a Cu film is stopped at an early stage after it is performed on a trench of 80 nm in width, wherein FIG. 6A illustrates a sample (a sample C) when the burial of the Cu film is stopped at an early stage after it is performed in a normal iPVD step and FIG. 6B illustrates a sample (a sample D) when the burial of the Cu film is stopped at an early stage after it is performed in a re-sputtering step.

FIGS. 7A and 7B are cross-sectional SEM photographs of samples when the burial of a Cu film is stopped at an early stage after it is performed on a trench of 80 nm in width, wherein FIG. 7A illustrates a sample (a sample E) when the burial of the Cu film is completed using only iPVD in a normal condition and FIG. 7B illustrates a sample (a sample F) when the burial of the Cu film is completed by performing an iPVD step in a normal condition after a re-sputtering step.

DETAILED DESCRIPTION

Figure 1:
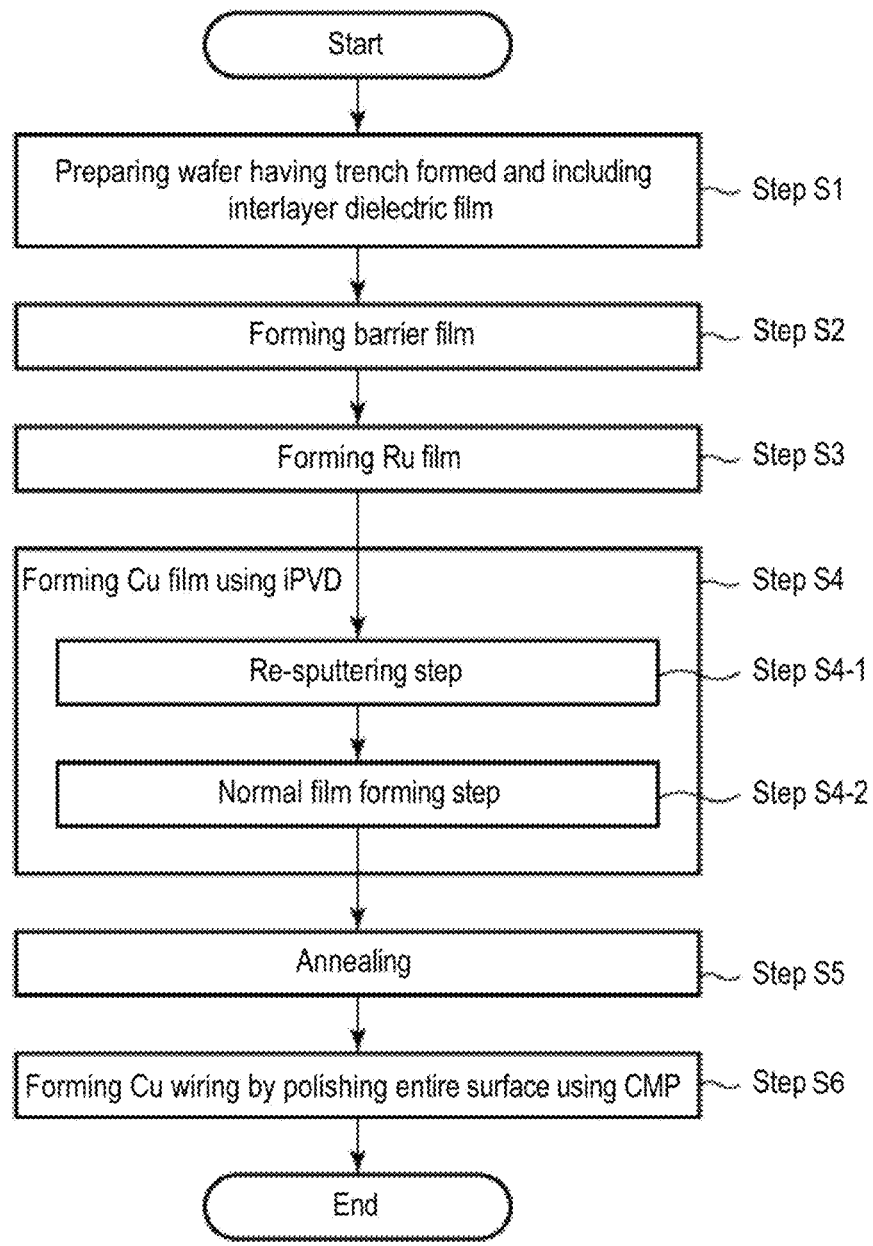
FIG. 1 is a flowchart illustrating a Cu wiring fabrication method in accordance with an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, some embodiments of the present disclosure are described with reference to the accompanying drawings. Furthermore, the same reference numerals are used to refer to the same elements throughout the drawings.

<Embodiment of Cu Wiring Fabrication Method>

First, an embodiment of a Cu wiring fabrication method of the present disclosure is described with reference to a flowchart of FIG. 1 and process cross-sectional views of FIGS. 2A to 2F.

Figure 2A:
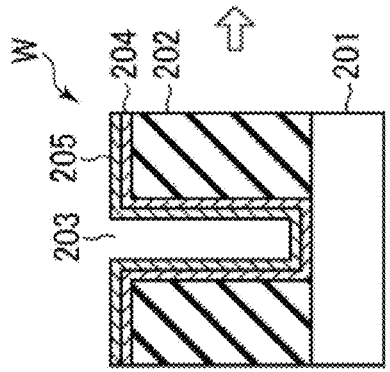
FIGS. 2A to 2F are process cross-sectional views illustrating a Cu wiring fabrication method in accordance with an embodiment of the present disclosure.

First, a semiconductor wafer (hereinafter simply called a wafer) W is prepared in which an interlayer dielectric film 202 formed of an Si-containing film, such as an $SiO_2$ film or a low dielectric (low-k) film (e.g., SiCO or SiCOH), is formed on an underlying structure 201 (not illustrated in detail) including the Cu wiring of a lower layer; and a trench 203 is formed in the interlayer dielectric film 202 in a specific pattern (Step S1, FIG. 2A). Furthermore, a via for connection to the Cu wiring of the lower layer may have been formed. Moisture on a surface of an insulating film or residue upon etching/ashing may be removed from the wafer W using a degassing process or a pre-clean process.

Figure 2B:
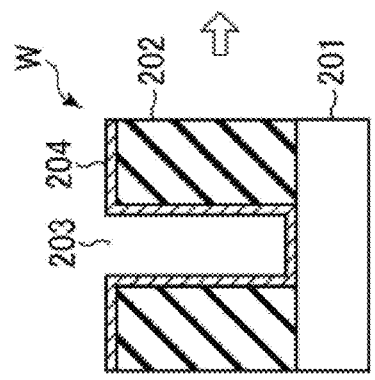

Subsequently, a barrier film 204 for suppressing the diffusion of Cu is formed on the entire surface including the trench 203 and a surface of the via (Step S2, FIG. 2B).

The barrier film 204 may have a high bather property for Cu and low resistance. A Ti film, the TiN film, a Ta film, a TaN film, or a dual film of Ta/TaN may be properly used as the barrier film 204. Furthermore, a TaCN film, a W film, a WN film, a WCN film, a Zr film, a ZrN film, a V film, a VN film, an Nb film, or an NbN film may be used as the barrier film 204. A Cu wiring has lower resistance as the volume of Cu buried in a trench or hole is increased. Thus, the barrier film may be formed very thinly. From this point of view, the Cu wiring may have a thickness of 1 to 20 nm. In some embodiments, the Cu wiring may have a thickness of 1 to 10 nm. The barrier film may be formed by iPVD, for example, a plasma sputter. In some embodiments, the barrier film may be formed by another PVD, such as a normal sputter or ion plating, or may be formed by CVD, ALD, CVD using plasma, or ALD using plasma.

Figure 2C:
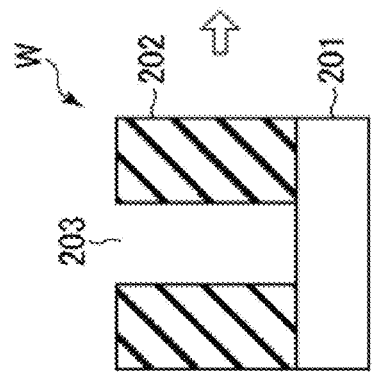

Subsequently, an Ru film 205, that is, a liner film, is formed on the barrier film 204 by CVD (Step S3, FIG. 2C). The Ru film may be thinly formed, for example, at a thickness of 1 to 5 nm in order to reduce wiring resistance by increasing the volume of the buried Cu.

Ru has high wettability for Cu. Accordingly, an excellent mobility of Cu can be secured when forming a Cu film using subsequent iPVD by forming an Ru film on the grounding of Cu, thereby making difficult for an overhang that blocks the width of a trench or hole to be formed. Accordingly, Cu can be surely buried without generating a void even in a micro trench or hole.

The Ru film using CVD may be suitably formed by thermal CVD using rutheniumcarbonyl $(Ru_3(CO)_{12})$ as a raw material for film forming. Accordingly, a thin Ru film with high purity can be formed with high step coverage. In this case, conditions for film forming may be as follows, for example. Pressure within a processing container is in the range of 1.3 to 66.5 Pa, and a film forming temperature (i.e., a wafer temperature) is in the range of 150 to 250 degrees C. The Ru film 205 using CVD may be formed using other raw materials for film forming, for example, a pentadienyl compound of ruthenium, such as (cyclopentadienyl) (2,4-dimethylpentadienyl)

ruthenium, bis(cyclopentadienyl)(2,4-methylpentadienyl)ruthenium, (2,4-dimethylpentadienyl) (ethylcyclopentadienyl) ruthenium, or bis(2,4-methylpentadienyl) (ethylcyclopentadienyl)ruthenium, in addition to ruthenium-carbonyl. Furthermore, in this case, the CVD also includes an atomic layer deposition (ALD) method.

Figure 2D:
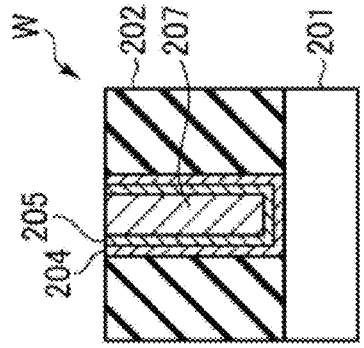

Subsequently, the trench 203 is buried with Cu by forming a Cu film 206 using iPVD, for example, a plasma sputter (Step S4, FIG. 2D). This process includes two steps of a re-sputtering step (Step S4-1) and a normal film forming step (Step S4-2) in a normal condition. Such a process is described in detail later. When forming the Cu film 206, the Cu film 206 may be stacked from the top of the trench 203 in preparation for subsequent planarization processing.

Figure 2E:
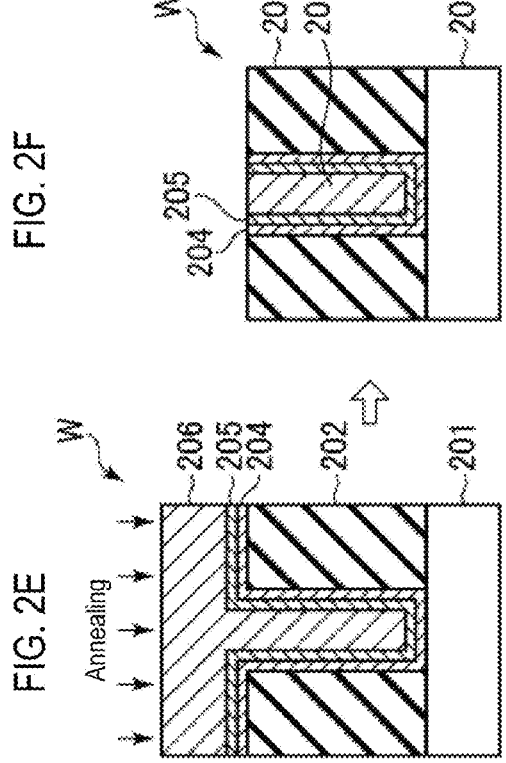

After forming the Cu film 206, annealing processing is performed, if necessary (Step S5, FIG. 2E). The Cu film 206 is stabilized by the annealing processing.

Figure 2F:
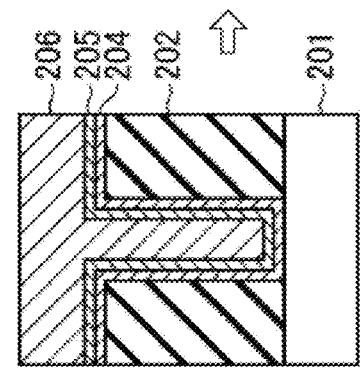

Subsequently, the entire surface of a surface of the wafer W is polished and planarized by chemical mechanical polishing (CMP) by removing a portion of the Cu film 206 higher than the trench 203, the Ru film 205, and the barrier film 204 (Step S6, FIG. 2F). Accordingly, a Cu wiring 207 is formed within the trench and the via (or hole).

Furthermore, after forming the Cu wiring 207, a proper cap film, such as a dielectric cap or a metal cap, is formed on the entire surface including the Cu wiring 207 and the interlayer dielectric film 202 on a surface of the wafer W.

<Cu Film Forming Process>

A process of forming the Cu film 206 is described in detail below.

The Cu film 206 is formed by iPVD, for example, a plasma sputter as described above. iPVD includes introducing a plasma generation gas, such as an Ar gas, into a processing container for plasma, ionizing Cu particles discharged from a target using ions of the plasma generation gas, for example, Ar ions, and introducing the Ar ions and the Cu ions into the wafer by applying a high frequency bias to the wafer, thereby forming the Cu film. Cu may be formed by controlling power (i.e., bias power) of the high frequency bias applied to the wafer so that Cu within a field portion flows (or reflows) in the trench by the action of the Ar ions and bottom-up is performed. Accordingly, it is difficult for the cohesion of Cu, such as in normal PVD film forming, to occur and the creation of an overhang in the width of the trench can be suppressed.

In this case, in a micro wiring, the volume of Cu is small, and the distance (i.e., a trench width) between trench sidewalls that define a wiring width is small. Accordingly, Cu can be easily stabilized within the trench when burying the trench, and thus a burial failure may not occur although a Cu film is formed by iPVD in a normal initial condition.

Figure 3A:
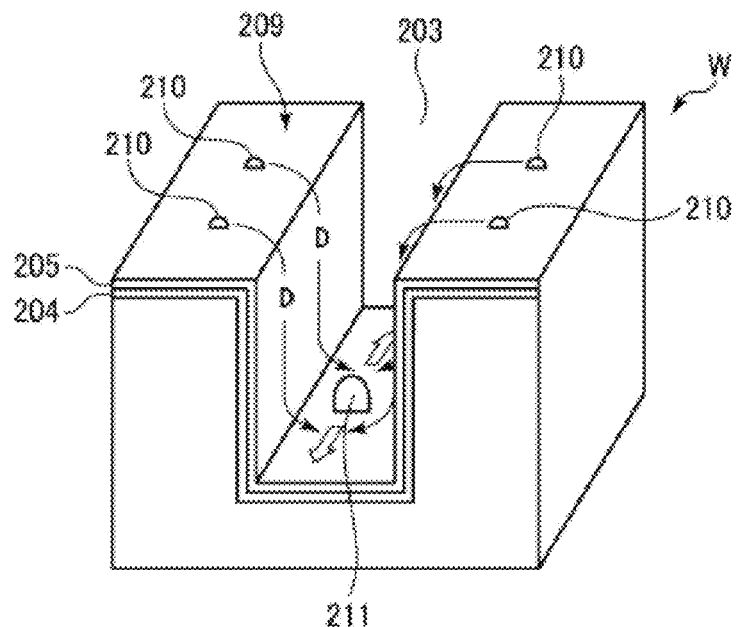

However, a single wiring layer includes wirings having wider widths in addition to a micro wiring of about 20 to 30 nm. Thus, if a trench width that defines a wiring width is increased, when forming a film using iPVD in a normal initial condition, as illustrated in FIG. 3A, Cu that has flown in the trench 203 from a field portion 209 on a surface of the wafer W gathers at the bottom of the trench 203, and the Cu 210 can freely move at that portion. Accordingly, pieces of the Cu 210 may together gather and easily form a large Cu lump at the bottom of the trench 203. If such a large Cu lump 211 is present, there is a possibility that a burial failure, such as that a uniform bottom-up is not performed or that a void is not formed. Furthermore, it was found that such a trend is likely to occur when a trench width exceeds 50 nm.

Accordingly, in the present embodiment, the Cu film forming process using iPVD at Step S4 is performed in two steps including a first re-sputtering step (Step S4-1) and a second normal film forming step (Step S4-2) as described above.

Figure 3B:
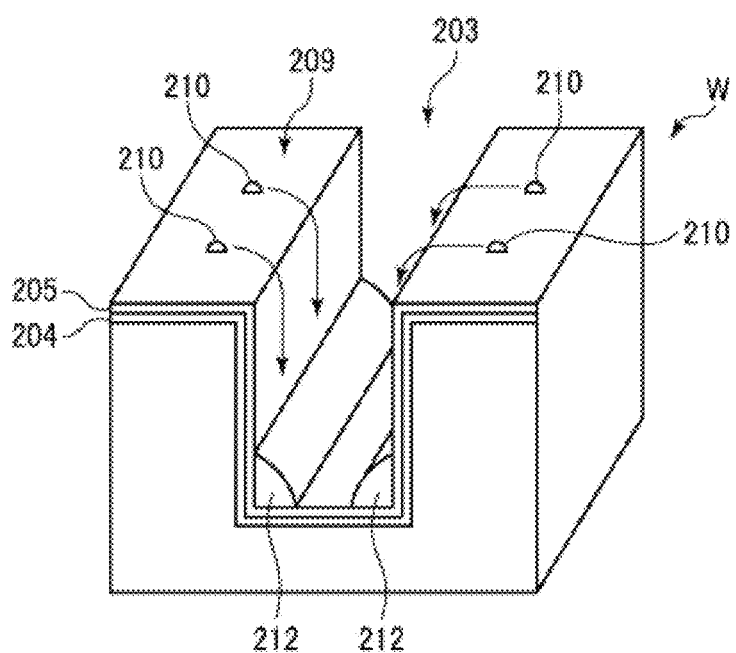

That is, the re-sputtering step (Step S4-1) is performed in a condition in which the formed Cu film is re-sputtered because the action of ions of a plasma generation gas, such as Ar ions, on the wafer W is strong. In this case, a condition in which the Cu film and ions of the plasma generation gas, such as Ar ions, are simultaneously etched may be used. Accordingly, the Cu film is chiefly formed at the lower angle portions of the trench, and stabilization Cu films 212 are formed at the lower angle portions of the trench as illustrated in FIG. 3B. In this state, if the action of Ar ions for the Cu film is weakened and the normal film forming step (Step S4-2) is performed in a normal condition, although a wiring width (or a trench width) increases over 50 nm, a movement of Cu to the bottom of the trench 203 is suppressed due to the presence of the stabilization Cu films 212. Accordingly, the forming of a Cu lump at the bottom of the trench 203 is suppressed.

Figure 4A:
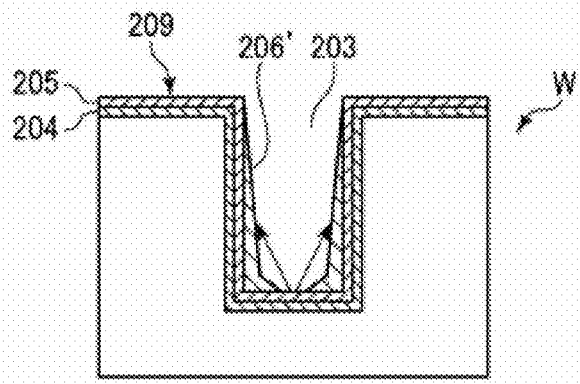
FIGS. 4A to 4C are diagrams illustrating the behavior of Cu within a trench when filling the trench using a re-sputtering step and a normal film forming step.
Figure 4B:
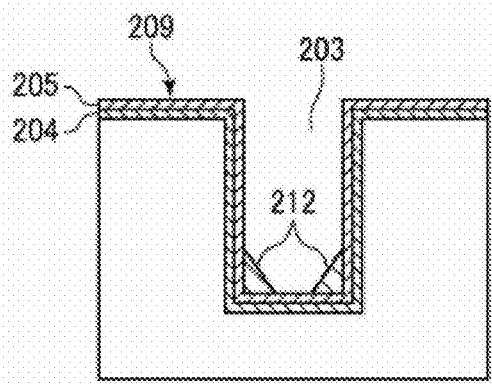
Figure 4C:
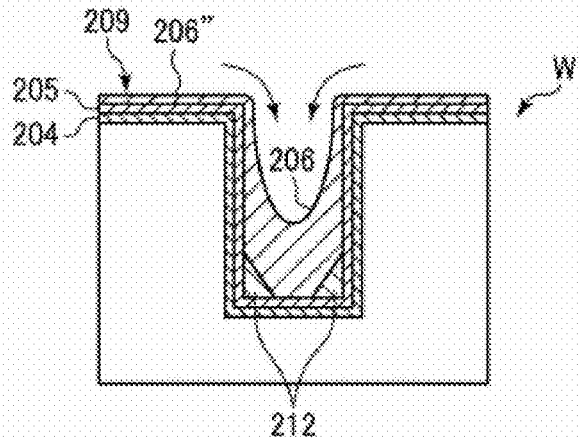

The behavior of Cu in the trench in this case is described in detail with reference to FIGS. 4A to 4C. That is, the re-sputtering step at Step S4-1 is a mode in which the formed Cu film can be sputtered by increasing the action of ions of the plasma generation gas, such as Ar ions. More specifically, processing pressure is reduced and a high frequency bias is increased so that ions, such as Ar ions, may easily enter the wafer W. In this case, the re-sputtering action of ions of the plasma generation gas, such as Ar ions, for the formed Cu film is increased by the accumulation action of Cu particles. Accordingly, a Cu film is rarely formed in portions having a great re-sputtering action, such as the field portion 209 on a surface of the wafer W and the center of the bottom of the trench 203, but an initial Cu film 206' is chiefly formed in trench sidewall parts and the lower angle portions of the trench (FIG. 4A). Furthermore, the formed initial Cu film 206' reflows from the sidewalls of the trench 203 to corners of the bottom of the trench 203 due to the ion impact of Ar ions and the action of heat. Accordingly, Cu chiefly gathers at the lower angle portions of the trench and is stabilized, thus forming the stabilization Cu films 212 (FIG. 4B). In this state, by performing the normal film forming step of Step S4-2 using iPVD in a normal condition, a Cu film 206" is formed on the field portion 209 and at the same time, the Cu film 206" of the field portion 209 reflow in the trench 203 and thus becomes the Cu film 206 as in FIG. 4C. In this case, although a wiring width (or a trench width) exceeds 50 nm, a movement of Cu at the bottom of the trench is suppressed because the stabilization Cu films 212 at the lower angle portions of the trench have been stably accumulated. Accordingly, the forming of a Cu lump at the bottom of the trench can be suppressed regardless of trench size. As a result, a burial failure, such that bottom-up is not uniformly performed or that a void is formed within the trench, can be suppressed.

The re-sputtering step of Step S4-1 has only to be performed during the period in which the Cu film is stably formed at the lower angle portions of the trench, and the Cu film forming process of Step S4 may be performed at an early stage.

In the Cu film forming process of Step S4, Steps S4-1 and S4-2 may be realized by only changing conditions for an iPVD apparatus. That is, in Step S4-2 of forming the Cu film using iPVD in a normal condition, a relatively high voltage, which may activate the straightness of Cu particles sputtered from a target, may be used because reflow from the field portion to the trench is important. For example, the relatively high voltage in a range of 35 to 90 mTorr (4.66 to 12.0 Pa) may be adopted. Furthermore, in this case, the power of a high frequency bias is to the degree of reflowing Cu. For example, 400 W may be used as the power of the high frequency bias. In contrast, in Step S4-1, in order to raise the re-sputtering action of an ion impact by effectively inputting plasma generation ions, such as Ar ions, to the wafer, low pressure of 1 to 5 mTorr (0.13 to 0.67 Pa), for example, may be used. Power of the high frequency bias applied to the wafer may be higher than that in Step S4-2, for example, 600 W. Furthermore, a high temperature process (e.g., 65 to 350 degrees C.) in which Cu may easily migrate may be used because the mobility of Cu is required for both Steps S4-1 and 4-2. Furthermore, a Cu wiring having lower resistance can be obtained because a Cu crystal grain is increased by such a high temperature process.

Furthermore, all the increment of the Cu film 206 may be formed by Steps S4-1 and 4-2, but the remainder may be formed by Cu plating after the intermediate portion of the Cu film 206 is formed by iPVD, such as that described above. Furthermore, the Cu film 206 may be made of a Cu alloy without being limited to pure Cu. In this case, a specific Cu alloy may be used as a target upon performing iPVD. The Cu alloy may be Cu—Mn, Cu—Al, Cu—Mg, Cu—Ag, Cu—Sn, Cu—Pb, Cu—Zn, Cu—Pt, Cu—Au, Cu—Ni, Cu—Co, or Cu—Ti. Among them, Cu—Mn is proper.

<Experiment Example>

An experimental example is described below.

First, a normal iPVD step is compared with a re-sputtering step. In this case, a TaN film, that is, a barrier film, was formed on an interlayer dielectric film in which a trench having a wiring width of 140 nm was formed by iPVD. After an Ru film was formed on the TaN film by CVD, the burial of a Cu film was performed in a normal iPVD step at a temperature of 275 degrees C. and was stopped at an initial stage (corresponding to a Cu film thickness of 10 nm) of the normal iPVD step, thereby completing a sample (sample A). Likewise, after an Ru film was formed, the burial of a Cu film was performed in a re-sputtering step at a temperature of 275 degrees C. and was stopped at an initial stage (corresponding to a Cu film thickness of 10 nm) of the re-sputtering step, thereby completing a sample (sample B). The cross sections of the samples A and B were monitored using a scanning electron microscope (SEM).

Furthermore, conditions for iPVD in the sample A were as follows; pressure within a processing container: 90 mTorr, and bias power: 400 W. Conditions for re-sputtering in the sample B were as follows: pressure: 1.5 mTorr, and bias power: 600 W.

Figure 5A:
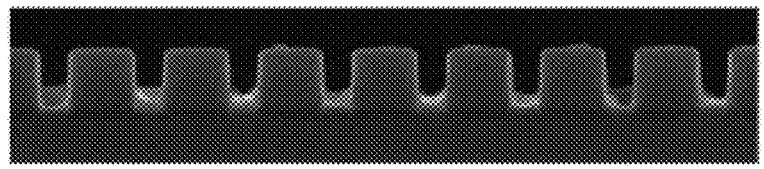
Figure 5B:
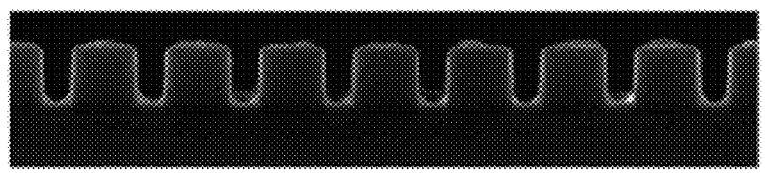

Cross-sectional SEM photographs are illustrated in FIGS. 5A and 5B. From FIG. 5A, it is seen that the sample A formed by normal iPVD has a great variation because the state of Cu is different in each trench. It is considered that such a variation was generated because Cu had freely moved at the bottom of the trench. From FIG. 5B, it is seen that the sample B on which the re-sputtering step was performed has a small variation in the trenches because Cu is accumulated on the lower angle portions of the trench in each trench.

Subsequently, in relation to a trench having a wiring width of 80 nm, in the same conditions, the burial of Cu was stopped at an initial stage (corresponding to a Cu film thickness 10 nm) of an iPVD step, thereby completing a sample (sample C). The burial of Cu was stopped at an initial stage (corresponding to a Cu film thickness 10 nm) of a re-sputtering step, thereby completing a sample (sample D). The samples C and D were monitored using a scam electron microscope (SEM).

Figure 6A:
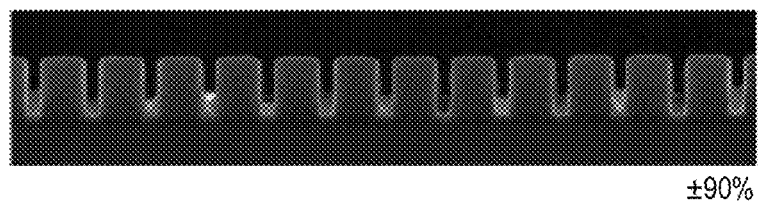
Figure 6B:
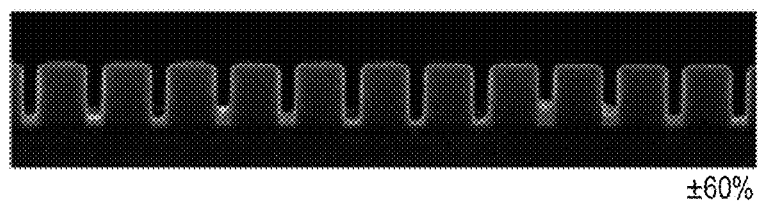

Cross-sectional SEM photographs are illustrated in FIGS. 6A and 6B. It was found that the sample C formed by normal iPVD had a great variation (±90%) in the height of Cu in each trench as illustrated in FIGS. 6A and 6B. In contrast, it was found that the sample D on which the re-sputtering step was performed had a variation in the height of Cu in the trenches because Cu was accumulated on the lower angle portions of the trenches as illustrated in FIG. 6B, but had a smaller variation (±60%) than the sample C.

Subsequently, a case where the burial of a Cu film was completed by iPVD in a normal condition was compared with a case where the burial of a Cu film was completed by an iPVD step in a normal condition after a re-sputtering step below. In this case, a TaN film, that is, a barrier film, was formed on an interlayer dielectric film in which a trench having a wiring width of 80 nm was formed by iPVD. An Ru film was formed on the TaN film by CVD. A Cu film was formed (corresponding to a Cu film thickness 40 nm) by only normal iPVD at a temperature of 275 degrees C., thereby completing a sample (sample E) in which the burial of Cu was completed. Likewise, after an Ru film was formed, a re-sputtering step was performed (corresponding to a Cu film thickness 10 nm) at a temperature of 275 degrees C. Subsequently, a normal iPVD step was performed (corresponding to a Cu film thickness 30 nm) at a temperature of 275 degrees C., thereby completing a sample (sample F) in which the burial of Cu was completed. The samples E and F were monitored using a scam electron microscope (SEM).

Furthermore, conditions for iPVD in the sample E and the sample F were as follows: pressure within the processing container: 90 mTorr, and bias power: 400 W. Conditions for re-sputtering in the sample F were as follows: pressure: 1.5 mTorr, and bias power: 600 W.

Figure 7A:
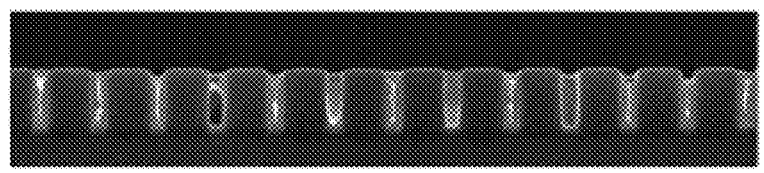
Figure 7B:
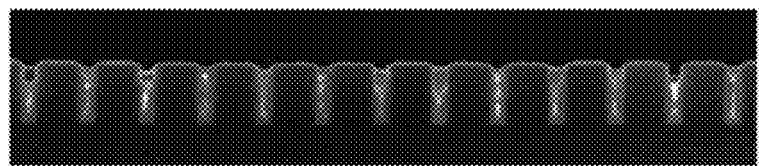

The results are illustrated in FIGS. 7A and 7B. The sample E formed by iPVD in the normal condition had a great void in the Cu film within the trench as illustrated in FIG. 7A. In contrast, the sample F on which iPVD was performed under normal conditions after re-sputtering had no void in the Cu film as illustrated in FIG. 7B.

<Cu Wiring Fabrication System Suitable for Implementation of The Present Disclosure>

Figure 8:
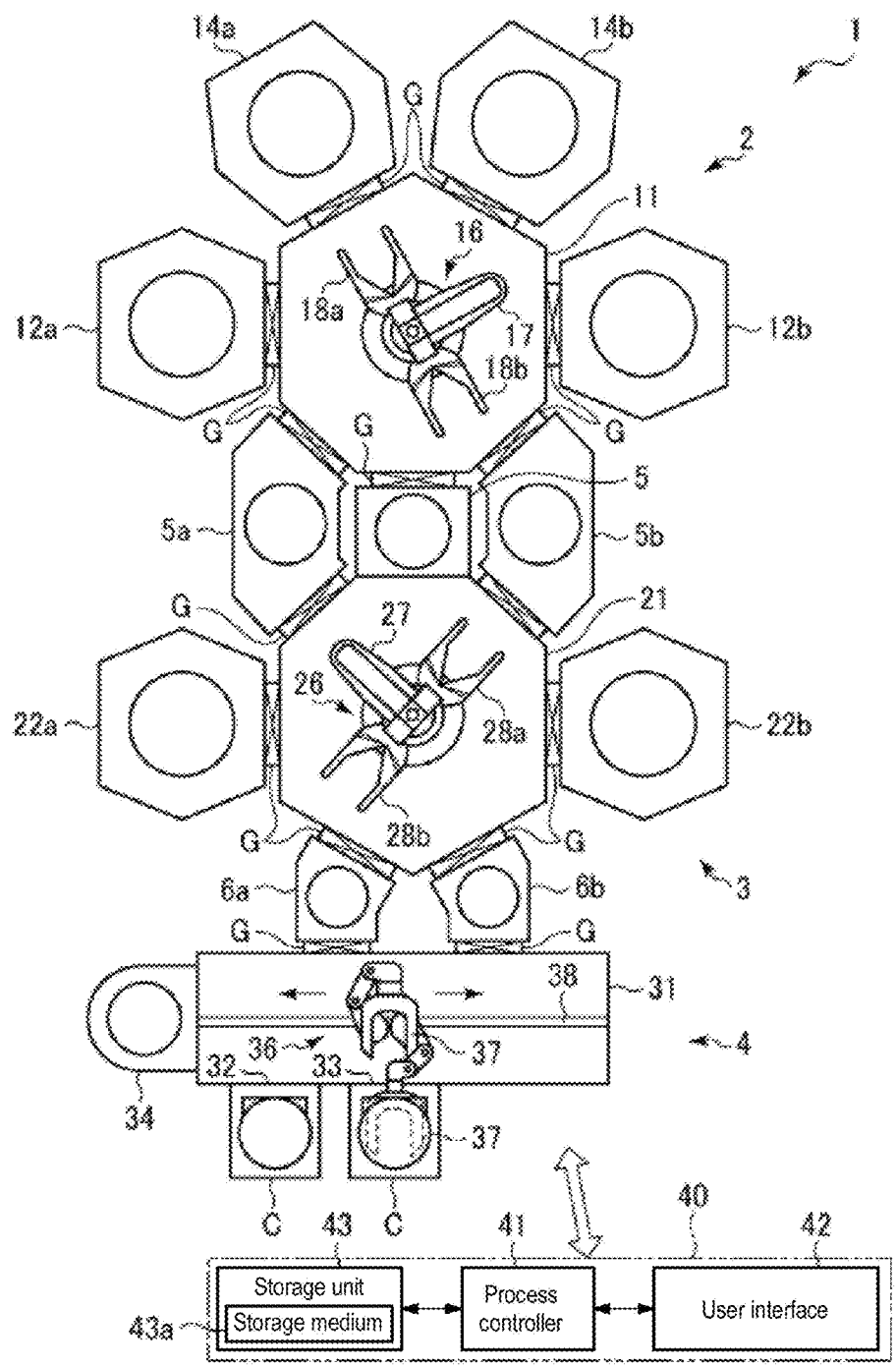
FIG. 8 is a schematic diagram illustrating an example of a Cu wiring fabrication system that is used in an implementation of the Cu wiring fabrication method in accordance with an embodiment of the present disclosure.

A Cu wiring fabrication system that is used in an implementation of the Cu wiring fabrication method in accordance with an embodiment of the present disclosure is described below. FIG. 8 is a schematic diagram illustrating an example of such a Cu wiring fabrication system.

A film forming system 1 includes a first processing unit 2 for forming a barrier film and an Ru film, a second processing unit 3 for forming a Cu film, and a carrying-in/out unit 4. The film forming system 1 performs forming a base film to a Cu film when forming a Cu wiring with respect to a wafer W in which a trench of a specific pattern has been formed.

The first processing unit 2 includes a first vacuum transfer chamber 11 and two barrier film forming apparatuses 12a and 12b and two Ru film forming apparatuses 14a and 14b connected to the wall parts of the first vacuum transfer chamber 11. The barrier film forming apparatus 12a and the Ru film forming apparatus 14a, and the barrier film forming apparatus 12b and the Ru film forming apparatus 14b are disposed at line symmetrical locations.

Degassing chambers 5a and 5b for performing degassing processing on the wafer W are connected to other wall parts of the first vacuum transfer chamber 11. Furthermore, a delivery chamber 5 for delivering the wafer W between the first vacuum transfer chamber 11 and a second vacuum transfer chamber 21 is connected to a wall part between the degassing chambers 5a and 5b of the first vacuum transfer chamber 11.

The barrier film forming apparatuses 12a and 12b, the Ru film forming apparatuses 14a and 14b, the degassing chambers 5a and 5b, and the delivery chamber 5 are connected to the respective faces of the first vacuum transfer chamber 11 with gate valves G interposed therebetween. They are made to communicate with or blocked from the first vacuum transfer chamber 11 by opening or closing of the corresponding gate valves G.

A specific vacuum atmosphere is maintained within the first vacuum transfer chamber 11. A first transfer mechanism 16 for carrying the wafer W is installed within the first vacuum transfer chamber 11. The first transfer mechanism 16 is disposed approximately at the center of the first vacuum transfer chamber 11, and includes a rotation·expansion/contraction unit 17 capable of rotation and expansion/contraction and two support arms 18a and 18b for supporting the wafer W installed at the front end of rotation·expansion/contraction unit 17. The first transfer mechanism 16 carries the wafer W in or out with respect to the barrier film forming apparatuses 12a and 12b, the Ru film forming apparatuses 14a and 14b, the degassing chambers 5a and 5b, and the delivery chamber 5.

The second processing unit 3 includes a second vacuum transfer chamber 21 and two Cu film forming apparatuses 22a and 22b connected to opposite wall parts of the second vacuum transfer chamber 21. The Cu film forming apparatuses 22a and 22b may be used as apparatuses for performing the burial of concave parts to the forming of a stack increment portion in a lot. The Cu film forming apparatuses 22a and 22b may perform up to an intermediate portion, and the remainder may be formed by plating.

The degassing chambers 5a and 5b are connected to each of two wall parts of the second vacuum transfer chamber 21 on the part of the first processing unit 2. The delivery chamber 5 is connected to a wall part between the degassing chambers 5a and 5b. That is, all the delivery chamber 5 and the degassing chambers 5a and 5b are installed between the first vacuum transfer chamber 11 and the second vacuum transfer chamber 21, and the degassing chambers 5a and 5b are disposed on both sides of the delivery chamber 5. Furthermore, load lock rooms 6a and 6b capable of atmosphere transfer and vacuum transfer are connected to each of the two wall parts on the part of the carrying-in/out unit 4.

The Cu film forming apparatuses 22a and 22b, the degassing chambers 5a and 5b, and the load lock rooms 6a and 6b are connected to the respective wall parts of the second vacuum transfer chamber 21 with gate valves G interposed therebetween. They are made to communicate with the second vacuum transfer chamber 21 by opening the corresponding gate valves G and are blocked from the second vacuum transfer chamber 21 by closing the corresponding gate valves G. Furthermore, the delivery chamber 5 is connected to the second vacuum transfer chamber 21 without a gate valve interposed therebetween.

A specific vacuum atmosphere is maintained within the second vacuum transfer chamber 21. A second transfer mechanism 26 for performing the carrying-in and -out of the wafer W with respect to the Cu film forming apparatuses 22a and 22b, the degassing chambers 5a and 5b, the load lock rooms 6a and 6b and the delivery chamber 5 is installed within the second vacuum transfer chamber 21. The second transfer mechanism 26 is disposed approximately at the center of the second vacuum transfer chamber 21 and includes a rotation·expansion/contraction unit 27 capable of rotation and expansion/contraction. Two support arms 28a and 28b for supporting the wafer W are installed at the front end of the rotation·expansion/contraction unit 27. The two support arms 28a and 28b are installed in the rotation·expansion/contraction unit 27 to face opposite directions.

The carrying-in/out unit 4 is installed on the side opposite the second processing unit 3 with the load lock rooms 6a and 6b interposed therebetween, and includes an atmosphere transfer chamber 31 to which the load lock rooms 6a and 6b are connected. A filter (not illustrated) for forming the down flow of clean air is installed at the top of the atmosphere transfer chamber 31. Gate valves G are installed in a wall part between the load lock rooms 6a and 6b and the atmosphere transfer chamber 31. Two connection ports 32 and 33 for connecting to carriers C for accommodating the wafers W, that is, substrates to be processed, are installed at a wall part opposite the wall part to which the load lock rooms 6a and 6b of the atmosphere transfer chamber 31 are connected. Furthermore, an alignment chamber 34 for aligning the wafers W is installed on the side of the atmosphere transfer chamber 31. A transfer mechanism 36 for atmosphere transfer for performing the carrying-in and -out of the wafer W for the carrier C and the carrying-in and -out of the wafer W for the load lock rooms 6 is installed within the atmosphere transfer chamber 31. The transfer mechanism 36 for atmosphere transfer includes two multi-joint arms. The transfer mechanism 36 is configured to travel on a rail 38 in the direction in which the carriers C are arranged and to load the wafer W onto the hand 37 at the front end thereof and transfer the loaded wafer W.

The film forming system 1 includes a control unit 40 for controlling the elements of the film forming system 1. The control unit 40 includes a process controller 41 formed of a microprocessor (or computer) for executing control of the elements, a user interface 42 formed of a keyboard through which an operator performs a manipulation for inputting a command in order to manage the film forming system 1 or a display for visualizing and displaying the operating state of the film forming system 1, and a storage unit 43 configured to store a control program for realizing processing executed by the film forming system 1 under the control of the process controller 41, various data, and a program, that is, a processing recipe, for enabling the elements of the processing apparatus to execute processing according to processing conditions. Furthermore, the user interface 42 and the storage unit 43 are connected to the process controller 41. The processing recipe is stored in the storage medium 43a of the storage unit 43. The storage medium may be a hard disk or a portable device, such as CD-ROM, a DVD, or flash memory. Furthermore, the recipe may be properly transmitted by another device, for example, through a dedicated line. Furthermore, a recipe may be read from the storage unit 43 in response to an instruction from the user interface 42, if necessary, and the process controller 41 executes processing according to the recipe. Accordingly, the film forming system 1 performs required processing under the control of the process controller 41.

In such a film forming system 1, the transfer mechanism 36 for atmosphere transfer extracts the wafer W having a trench of a specific pattern from the carrier C and transfers the wafer W to the load lock room 6a or 6b. The load lock room 6a or 6b is decompressed in the same degree of vacuum as that of the second vacuum transfer chamber 21. The second transfer mechanism 26 transfers the wafer W of the load lock room 6a or 6b to the degassing chamber 5a or 5b through the second vacuum transfer chamber 21, and degassing processing of the wafer W is performed. Subsequently, the first transfer mechanism 16 extracts the wafer W from the degassing chamber 5a or 5b and carries the extracted wafers in the barrier film forming apparatus 12a or 12b through the first vacuum transfer chamber 11, and a barrier film is formed. After the barrier film is formed, the first transfer mechanism 16 extracts the wafer W from the barrier film forming apparatus 12a or 12b and carries the wafer W in the Ru film forming apparatus 14a or 14b, and an Ru film is formed. After the Ru film is formed, the first transfer mechanism 16 extracts the wafer W from the Ru film forming apparatus 14a or 14b and carries the extracted wafer W in the delivery chamber 5. Subsequently, the second transfer mechanism 26 extracts the wafer W from the delivery chamber 5, carries the extracted wafer W in the Cu film forming apparatus 22a or 22b through the second vacuum transfer chamber 21, a Cu film is formed by the two steps as described above, and Cu is buried in the trench. In this case, the Cu film forming apparatus 22a or 22b may form up to a stack increment portion in a lot as described above, but may form the intermediate portion of the Cu film and the remainder may be formed by plating.

After the Cu film is formed, the wafer W is transferred to the load lock room 6a or 6b and the load lock room is returned to atmospheric pressure. The transfer mechanism 36 for atmosphere transfer extracts the wafer W on which the Cu film has been formed and returns the extracted wafer W to the carrier C. Such processing is repeated by the number of wafers W within the carrier.

In accordance with such a film forming system 1, oxidization on a surface after each process can be prevented and a high-performance Cu wiring can be obtained because a barrier film, an Ru film, a Cu film, and an increment layer can be formed in vacuum without exposing them to the atmosphere.

Furthermore, after the processing in the film forming system 1 is terminated, separate apparatuses may perform an annealing process and a CMP process on the wafer W after the wafer W is extracted from the film forming system 1. The separate apparatuses may be normal apparatuses.

<Cu Film Forming Apparatus>

Figure 9:
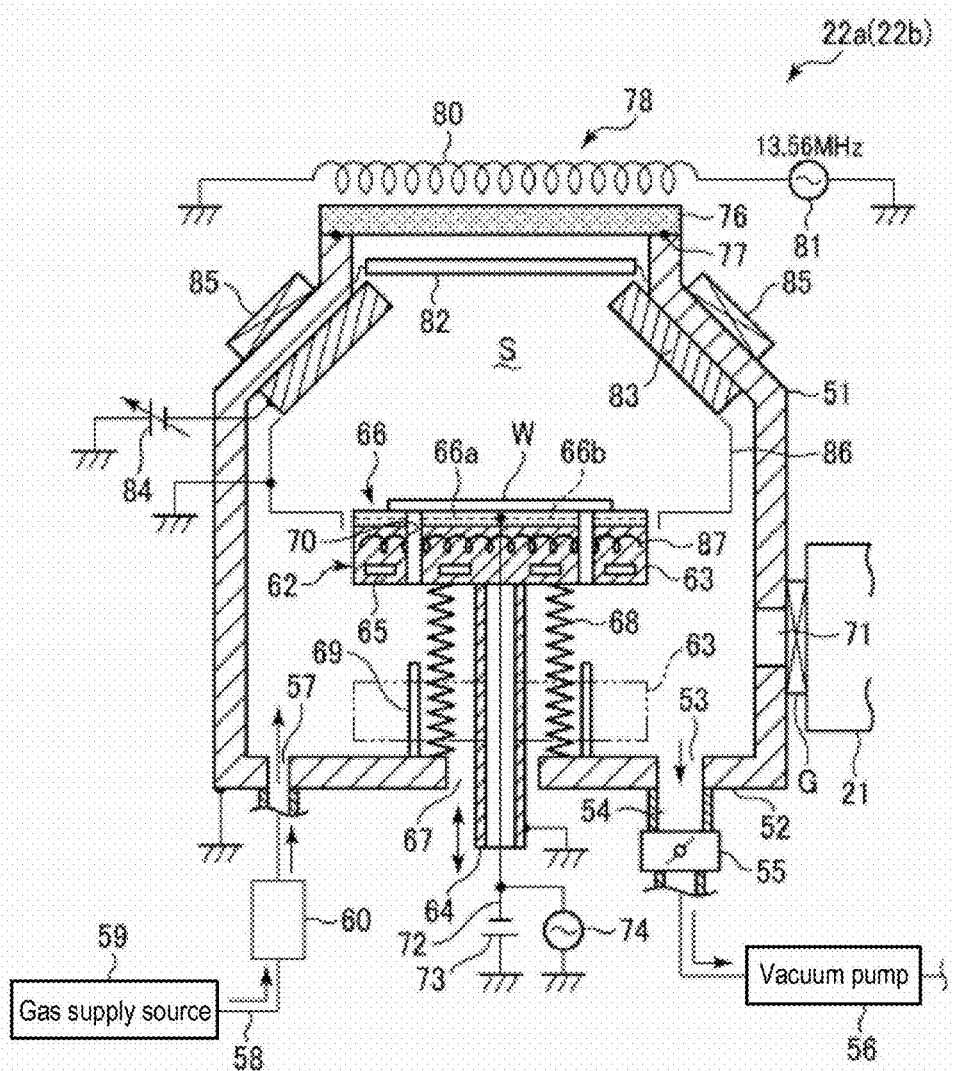
FIG. 9 is a cross-sectional view illustrating an example of a Cu film forming apparatus mounted on the film forming system of FIG. 8 and configured to form the Cu film.

A suitable example of the Cu film forming apparatus 22a, 22b that is used to form a Cu film in a major process according to the present disclosure is described below. FIG. 9 is a cross-sectional view illustrating an example of the Cu film forming apparatus.

In this case, for example, an inductively-coupled plasma (ICP) type plasma sputter apparatus is described as an iPVD film forming apparatus that forms the Cu film forming apparatus.

As illustrated in FIG. 9, the Cu film forming apparatus 22a, 22b includes a processing container 51 made of metal and molded in a cylindrical shape. The processing container 51 is grounded, an exhaust port 53 is installed at the bottom 52 of the processing container 51, and an exhaust pipe 54 is connected to the exhaust port 53. A throttle valve 55 and a vacuum pump 56 for controlling pressure are connected to the exhaust pipe 54 so that the inside of the processing container 51 can be vacuumed. Furthermore, a gas introduction port 57 for introducing a specific gas into the processing container 51 is installed at the bottom 52 of the processing container 51. A gas supply pipe 58 is connected to the gas introduction port 57. A gas supply source 59 for supplying a rare gas, for example, an Ar gas or another required gas, such as an $N^2$ gas, as a gas for plasma generation (or for excitation) is connected to the gas supply pipe 58. Furthermore, a gas control unit 60 formed of a gas flow rate controller and a valve is interposed and mounted on the gas supply pipe 58.

A mounting mechanism 62 for the wafer W is installed in the processing container 51. The mounting mechanism 62 includes a conductive loading stand 63 molded in a disk form and a post 64 of a hollow cylindrical body shape configured to support the loading stand 63. The loading stand 63 is grounded via the post 64. A cooling jacket 65 and a resistance heater 87 installed on the cooling jacket 65 are buried in the loading stand 63. A thermocouple (not illustrated) is installed in the loading stand 63. The cooling jacket 65 and the resistance heater 87 controls a wafer temperature based on a temperature detected by the thermocouple.

An electrostatic chuck 66 of a thin disk shape configured by burying an electrode 66b in the dielectric member 66a is installed on top of the loading stand 63 so that the wafer W can be adsorbingly maintained by an electrostatic force. Furthermore, the lower part of the post 64 penetrates an insertion through hole 67 formed at the center of the bottom 52 of the processing container 51 and extends downward. The post 64 is configured to move up and down by an elevation mechanism (not illustrated), so the entire mounting mechanism 62 goes up and down.

Metal bellows 68 that can expand and contract are installed to surround the post 64. The metal bellows 68 have the top airtightly bonded to the bottom of the loading stand 63 and the bottom airtightly bonded to the top of the bottom 52 of the processing container 51. Accordingly, airtightness within the processing container 51 can be maintained and the mounting mechanism 62 is also permitted to move up and down.

Furthermore, for example, three (only two illustrated) support pins 69 are vertically installed in the bottom 52 upward. Furthermore, pin insertion through holes 70 corresponding to the respective support pins 69 are formed in the loading stand 63. Accordingly, when the loading stands 63 drop, the tops of the support pins 69 that penetrate the pin insertion through holes 70 may receive the wafer W so that the wafer W is moved and mounted between the support pins 69 and a transfer arm (not illustrated) that moves in from the outside. A carrying-in/output port 71 through which the transfer arm moves is installed in the sidewall of the lower part of the processing container 51. A gate valve G configured to open and close is installed in the carrying-in/output port 71.

A power source for chuck 73 is connected to the electrode 66b of the electrostatic chuck 66 with a feed power line 72 interposed therebetween. When the power source for chuck 73 applies a DC voltage to the electrode 66b, the wafer W is absorbingly maintained by an electrostatic force. Furthermore, a high frequency power source for bias 74 is connected to the feed power line 72. High frequency power for bias is supplied to the electrode 66b of the electrostatic chuck 66 through the feed power line 72, and thus a high frequency bias is applied to the wafer W. The high frequency bias may have a frequency of 400 kHz to 60 MHz, and for example, a frequency of 13.56 MHz may be adopted.

A transmitting plate 76 for high frequency transmission made of a dielectric substance is airtightly installed in the ceiling part of the processing container 51 with a seal member 77 interposed therebetween. A plasma generation source 78 for generating plasma by a rare gas, for example, an Ar gas as a gas for exciting plasma in a processing space S within the processing container 51 is installed on top of the transmitting plate 76.

The plasma generation source 78 includes an induction coil 80 installed in accordance with the transmitting plate 76. A high frequency power source 81 for generating plasma, for example, a high frequency power of 13.56 MHz, is connected to the induction coil 80. When the high frequency power source 81 applies high frequency power to the induction coil 80, an induced electric field is formed in the processing space S through the transmitting plate 76.

Furthermore, a baffle plate 82 made of metal and configured to spread high frequency power applied thereto is installed under the transmitting plate 76. A target 83 made of Cu and configured to have a hollow conical shell shape and surround the side of the upper part of the processing space S is installed under the baffle plate 82. A DC power source 84 that has a variable voltage and applies DC power for attracting Ar ions is connected to the target 83. AC power may be used instead of the DC power. Furthermore, when a Cu alloy film is formed instead of a Cu film, a Cu alloy is used as the target 83.

Furthermore, a magnet 85 for applying a magnetic field to the target 83 is installed on the outer circumference side of the target 83. The target 83 is sputtered as metal atoms or groups of metal atoms of Cu by the Ar ions included in plasma, and most of the target 83 is ionized while passing through the plasma.

Furthermore, a protection cover member 86 that forms a cylindrical shape to surround the processing space S is installed under the target 83. The protection cover member 86 is grounded, and the end of the inside of the protection cover member 86 is installed to surround the outer circumference of the loading stand 63.

In the Cu film forming apparatus configured as described above, the wafer W is carried in the processing container 51, loaded onto the loading stand 63, and absorbed by the electrostatic chuck 66. In this case, the loading stand 63 controls a temperature through the cooling jacket 65 or the resistance heater 87 based on a temperature detected by the thermocouple (not illustrated).

In this state, the following operation is performed under the control of the control unit 40.

First, when the vacuum pump 56 is driven, an Ar gas flows in the processing container 51 having a high vacuum state of $1 \times 10^{-7}$ Torr or less at a specific flow rate through control of the gas control unit 60 and at the same time, the inside of the processing container 51 maintains a specific degree of vacuum through control of the throttle valve 55. Subsequently, the variable DC power source 84 supplies DC power to the target 83. Furthermore, the high frequency power source 81 of the plasma generation source 78 supplies high-frequency power plasma power to the induction coil 80. The high frequency power source for bias 74 supplies high frequency power for a specific bias to the electrode 66b of the electrostatic chuck 66.

Ar plasma is formed within the processing container 51 by the high frequency power supplied to the induction coil 80. The Ar ions included in the plasma are attracted by the DC voltage applied to the target 83. The attracted Ar ions collide against the target 83, thereby being sputtered. Accordingly, particles are emitted. In this case, the amount of the particles emitted by the DC voltage applied to the target 83 is optimally controlled. The DC power applied to the target 83 may be 4 to 12 kW, for example, 6 to 10 kW.

Furthermore, most of the sputtered particles from the target 83 are ionized while passing through the plasma. The ionized particles are mixed with neutral atoms, that is, an electrically neutral, and scattered downward. In this case, a ratio of ionization is controlled by the high frequency power supplied by the high frequency power source 81.

When the ionized particles enter an ion sheath region of about several mm in thickness that is formed in a surface of the wafer W by high frequency power for bias supplied from the high frequency power source for bias 74 to the electrode 66b of the electrostatic chuck 66, the ionized particles are attracted toward the wafer W so that they are accelerated with strong directivity. Accordingly, a Cu film is formed on the wafer W.

In this case, a wafer temperature is set high (for example, 65 to 350 degrees C.) in order to secure the mobility of Cu. Furthermore, the aforementioned re-sputtering step and normal film forming step are performed by controlling power of the high frequency bias applied from the high frequency power source for bias 74 to the electrode 66b of the electrostatic chuck 66 and pressure within the processing container 51.

In first performing the re-sputtering step as described above, in order to increase the re-sputtering action by effectively introducing the Ar ions into the wafer W, low pressure of 1 to 5 mTorr (0.13 to 0.67 Pa), for example, is maintained within the processing container 51, and the bias power applied from the high frequency power source for bias 74 to the wafer W is set to a high bias power of 600 W, for example.

In the re-sputtering step, after Cu is accumulated on the lower angle portions of a trench, a normal film forming step is performed. In this case, relatively high pressure that can activate the straightness of the sputtered Cu may be used because reflow from the field portion on a surface of the wafer W to the trench is increased and a Cu film is buried. The relatively high pressure may be in the range of 35 to 90 mTorr (4.66 to 12.0 Pa), for example. Furthermore, in this case, power of the high frequency bias has only to be a level that reflows Cu, and the bias power applied from the high frequency power source for bias 74 to the wafer W is a value lower than that in the re-sputtering step, for example, 400 W.

Accordingly, although a wiring width (or a trench width) exceeds 50 nm, a movement of Cu at the bottom of a trench is suppressed. Accordingly, a burial failure can be suppressed because a Cu lump is prevented from being formed at the bottom of the trench.

OTHER APPLICATIONS

Although the embodiments of the present disclosure have been described, the present disclosure is not limited to the embodiments and may be modified in various ways. For example, the film forming system and the Cu film forming apparatus are simple examples, and the present disclosure is not limited thereto.

Furthermore, in the aforementioned embodiments, a semiconductor wafer has been illustrated as a substrate to be processed. The semiconductor wafer may include compound semiconductors, such as GaAs, SiC, and GaN, in addition to silicon. Furthermore, the present disclosure is not limited to a semiconductor wafer and may be applied to a glass substrate used in a liquid crystal display apparatus, such as a flat panel display (FPD), and a ceramic substrate.

According to the present disclosure in some embodiments, when forming a Cu film or a Cu alloy film, first, processing is performed in a condition in which the formed Cu film or Cu alloy film is re-sputtered by the ion action of a plasma generation gas. A first process for forming the Cu film or the Cu alloy film at the corners of the bottom of a trench while the formed Cu film or Cu alloy film is re-sputtered is performed. Accordingly, although the Cu film or the Cu alloy film is stabilized at the corners of the bottom of the trench and the width of the trench exceeds 50 nm, a Cu lump can be prevented from being formed at the bottom of the trench regardless of a trench size because a movement of Cu at the bottom of the trench is suppressed in a second process. Accordingly, a burial failure, such as a bottom-up that is not uniformly performed or a void that is formed within the trench, can be suppressed.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A Cu wiring fabrication method for fabricating a Cu wiring with respect to a substrate having an interlayer dielectric film on which a trench of a specific pattern is formed, the method comprising:
  forming a barrier film on at least a surface of the trench;
  forming an Ru film on a surface of the barrier film by CVD; and
  burying the trench by forming a Cu film or a Cu alloy film on the Ru film,
  wherein when forming the Cu film or the Cu alloy film, a film forming apparatus is used, wherein the film forming apparatus is configured to have the substrate disposed in a processing container, generate plasma by supplying a plasma generation gas to the processing container, discharge particles formed of Cu or a Cu alloy from a target formed of Cu or a Cu alloy and disposed in the processing container, ionize the particles formed of Cu or the Cu alloy by ions of the plasma generation gas within the processing container, apply a high frequency bias to the substrate, and introduce the ions of the plasma generation gas and the ionized particles formed of Cu or the Cu alloy into the substrate,
  forming a Cu film or Cu alloy film at corners of a bottom of the trench while re-sputtering the formed Cu film or Cu alloy film in a condition in which a first formed Cu film or Cu alloy film is re-sputtered by an ion action of the plasma generation gas, wherein the re-sputtering involves reflow, whereby the Cu film or the Cu alloy film is chiefly formed at sidewall parts of the trench and lower angle portions of the trench by the re-sputtering, and the Cu film or the Cu alloy film at the sidewall parts of the trench is stabilized by being reflowed to the bottom corners of the trench by the ion action of the plasma generation gas, and
  subsequently burying the Cu film or the Cu alloy film in the trench in a condition in which the Cu film or the Cu alloy film is formed on a field portion of the substrate, and the Cu film or Cu alloy film of the field portion reflows in the trench by an ion action of the plasma generation gas.

2. The Cu wiring fabrication method of claim 1, wherein the film forming apparatus is a plasma sputter apparatus for forming the Cu film or the Cu alloy film by sputtering the target in the plasma.

3. The Cu wiring fabrication method of claim 1, wherein the plasma generation gas is an Ar gas.

4. The Cu wiring fabrication method of claim 1, wherein the Cu wiring is fabricated by stacking the Cu film or the Cu alloy film over a top of the trench and then polishing an entire surface of the substrate.

5. The Cu wiring fabrication method of claim 1, wherein a width of the trench defining a wiring width is 50 nm or more.

6. The Cu wiring fabrication method of claim 1, wherein the Cu alloy forming the Cu alloy film is selected from Cu—Mn, Cu—Al, Cu—Mg, Cu—Ag, Cu—Sn, Cu—Pb, Cu—Zn, Cu—Pt, Cu—Au, Cu—Ni, Cu—Co, and Cu—Ti.

7. The Cu wiring fabrication method of claim 1, wherein the barrier film is selected from a group consisting of a Ti film, a TiN film, a Ta film, a TaN film, a dual film of Ta/TaN, a TaCN film, a W film, a WN film, a WCN film, a Zr film, a ZrN film, a V film, a VN film, an Nb film, and an NbN film.

8. A non-transitory computer-readable storage medium storing a program operated on a computer, for controlling a Cu wiring fabrication system, wherein when the program is executed, the program makes the computer control the Cu wiring fabrication system so that a Cu wiring fabrication method according to claim 1 is executed.

* * * * *